(12) United States Patent
Magnani et al.

(10) Patent No.: US 8,094,460 B2
(45) Date of Patent: Jan. 10, 2012

(54) ORIENTATION-TOLERANT LAND PATTERN AND METHOD OF MANUFACTURING THE SAME

(75) Inventors: Brad G. Magnani, Moorpark, CA (US); Raymond Eng, Arcadia, CA (US); Susan M. Plul, Calabasas, CA (US)

(73) Assignee: Alcatel Lucent, Paris (FR)

( * ) Notice: Subject to any disclaimer, the term of this patent is extended or adjusted under 35 U.S.C. 154(b) by 425 days.

(21) Appl. No.: 12/352,299

(22) Filed: Jan. 12, 2009

(65) Prior Publication Data

US 2010/0177491 A1 Jul. 15, 2010

(51) Int. Cl.
*H05K 7/00* (2006.01)
(52) U.S. Cl. ........ 361/767; 361/768; 361/772; 361/777; 361/782; 174/262
(58) Field of Classification Search .......... 174/260–263, 174/250; 361/760, 767, 768, 772–777, 782, 361/752, 808
See application file for complete search history.

(56) References Cited

U.S. PATENT DOCUMENTS

| | | | | |
|---|---|---|---|---|
| 5,379,189 A | * | 1/1995 | Merriman | 361/760 |
| 5,425,647 A | * | 6/1995 | Mencik et al. | 439/83 |
| 5,894,401 A | * | 4/1999 | Asakura et al. | 361/303 |
| 6,274,824 B1 | * | 8/2001 | Rueda-Aguilocho et al. | 174/261 |
| 6,331,930 B1 | * | 12/2001 | Kuroda et al. | 361/306.3 |
| 6,781,816 B2 | * | 8/2004 | Togashi | 361/306.3 |
| 6,985,899 B2 | * | 1/2006 | Chan et al. | 1/1 |
| 2006/0198083 A1 | * | 9/2006 | Kobayashi et al. | 361/540 |

* cited by examiner

*Primary Examiner* — Dameon Levi
*Assistant Examiner* — Hoa C Nguyen
(74) *Attorney, Agent, or Firm* — Hitt Gaines, PC

(57) ABSTRACT

A land pattern, a method of manufacturing a printed circuit board (PCB) and a PCB incorporating a land pattern. In one embodiment, the land pattern includes: (1) a quadrilateral component outline area having diagonally opposed first and second corners and diagonally opposed third and fourth corners, defined according to a body configuration of a particular component type and located on a surface of a substrate and (2) first and second exposed conductive pads located within said area respectively proximate said first and second corners, coupled to respective first and second circuit conductors of said substrate, configured according to a terminal configuration of said type and separated from said third and fourth corners such that a component of said particular component type may be placed on the land pattern in multiple orientations without causing a short circuit.

29 Claims, 3 Drawing Sheets

ORIENTATION-TOLERANT LAND PATTERN AND METHOD OF MANUFACTURING THE SAME

TECHNICAL FIELD

The following disclosure is directed, in general, to land patterns for printed circuit boards (PCBS) and other substrates on which electronic components may be mounted.

BACKGROUND

PCBs and other substrates are routinely employed to mount and interconnect electronic components, such as integrated circuits (ICs) and discrete components (e.g., capacitors, inductors, diodes and resistors), to form larger assemblies or whole circuits. A bare, or "unpopulated," PCB or other substrate is assembled through a manual or automated, "pick and place," process in which components are picked off a tape or other feeder and placed in specified locations and orientations (called "rotations") on various land patterns provided thereon. Herein, a land pattern is a group of exposed conductive pads configured to receive and provide mechanical support and electrical connections for a specified electronic component. Through-hole and surface mount electronic components are soldered into place on the land pattern to complete a mechanical and electrical connection to the PCB or other substrate on which the land pattern is located.

SUMMARY

One aspect provides a land pattern. In one embodiment, the land pattern includes: (1) a quadrilateral component outline area having diagonally opposed first and second corners and diagonally opposed third and fourth corners, defined according to a body configuration of a particular component type and located on a surface of a substrate and (2) first and second exposed conductive pads located within the area respectively proximate the first and second corners, coupled to respective first and second circuit conductors of the substrate, configured according to a terminal configuration of the type and separated from the third and fourth corners such that a component of the particular component type may be placed in one of: (2a) a first orientation in which a first terminal of the component contacts the first pad and extends between the first and the third corners and a second terminal of the component contacts the second pad and extends between the second and the fourth corners and (2b) a second orientation in which the first terminal contacts the first pad and extends between the first and fourth corners and the second terminal contacts the second pad and extends between the second and the third corners.

Another aspect provides a method of manufacturing a PCB. In one embodiment, the method includes: (1) forming a laminated substrate containing circuit conductors, (2) creating land patterns on at least one major surface of the substrate, some of the land patterns each including: (2a) a quadrilateral component outline area having diagonally opposed first and second corners and diagonally opposed third and fourth corners, defined according to a body configuration of a particular component type and located on one of the at least one major surface and (2b) first and second exposed conductive pads located within the area respectively proximate the first and second corners, coupled to respective first and second circuit conductors of the substrate, configured according to a terminal configuration of the type and separated from the third and fourth corners such that a component of the particular component type may be placed in one of: (2bi) a first orientation in which a first terminal of the component contacts the first pad and extends between the first and the third corners and a second terminal of the component contacts the second pad and extends between the second and the fourth corners and (2bii) a second orientation in which the first terminal contacts the first pad and extends between the first and fourth corners and the second terminal contacts the second pad and extends between the second and the third corners.

Yet another aspect provides a PCB. In one embodiment, the PCB includes: (1) a substantially square component outline area having diagonally opposed first and second corners and diagonally opposed third and fourth corners, defined according to a substantially square body configuration of a particular component type and located on a surface of a substrate, (2) first and second exposed conductive pads located within the area respectively proximate the first and second corners, coupled to respective first and second circuit conductors of the substrate and configured according to a terminal configuration of the type and (3) third and fourth exposed mounts located within the area respectively proximate the third and fourth corners, the first and second pads separated from the third and fourth corners and the third and fourth mounts separated from the first and second corners such that a component of the particular component type may be placed in one of: (3a) a first orientation in which a first terminal of the component contacts the first pad and the third mount and a second terminal of the component contacts the second pad and the fourth mount and (3b) a second orientation in which the first terminal contacts the first pad and the fourth mount and the second terminal contacts the second pad and the third mount.

Still another aspect provides an apparatus. In one embodiment, the apparatus includes: (1) a substrate or circuit board having a land pattern along a surface of the substrate or circuit board and (2) an electronic component having two or more terminals electrically connected to conductive pads of the land pattern, wherein the terminals of the component and land pattern are configured such that the terminals are able to contact the contact pads in a first orientation of the component and a second orientation of the component, the second orientation being related to the first orientation by a rotation of the component by about 60° to about 120° or by about 150° to about 210°, the terminals of the component having different footprints along the surface in the first and second orientations.

BRIEF DESCRIPTION OF THE DRAWINGS

For a more complete understanding, reference is now made to the following descriptions taken in conjunction with the accompanying drawings, in which.

DETAILED DESCRIPTION

As stated above, PCBs or other substrates are populated by mounting components on them in particular locations and orientations, which their land patterns dictate. Mislocated components are easier to identify than misoriented components and have fewer consequences, since mislocated components are unlikely to make electrical contact and create short circuits. Unfortunately, misorientations of components are less apparent and potentially more harmful. Relatively small, generally square components, such as discrete capacitors, inductors, diodes and resistors, are more likely to be misoriented than larger, elongated components. Irrespective of the cause, a PCB or other substrate that has misoriented components may be destroyed if power is applied to it. New product introductions may be delayed or manufacturing or warranty costs may escalate as a result.

Manufacturers therefore work hard to prevent component mislocation and misorientation during assembly. To date, they have focused their efforts on more careful assembly and inspection. It has been found, however, that land patterns may be designed to be more robust, such that they can tolerate misorientations without producing error. Consequently, various embodiments of a orientation-tolerant land pattern, methods of manufacturing a PCB and a PCB that incorporates a orientation-tolerant land pattern will be described herein.

Figure 1:
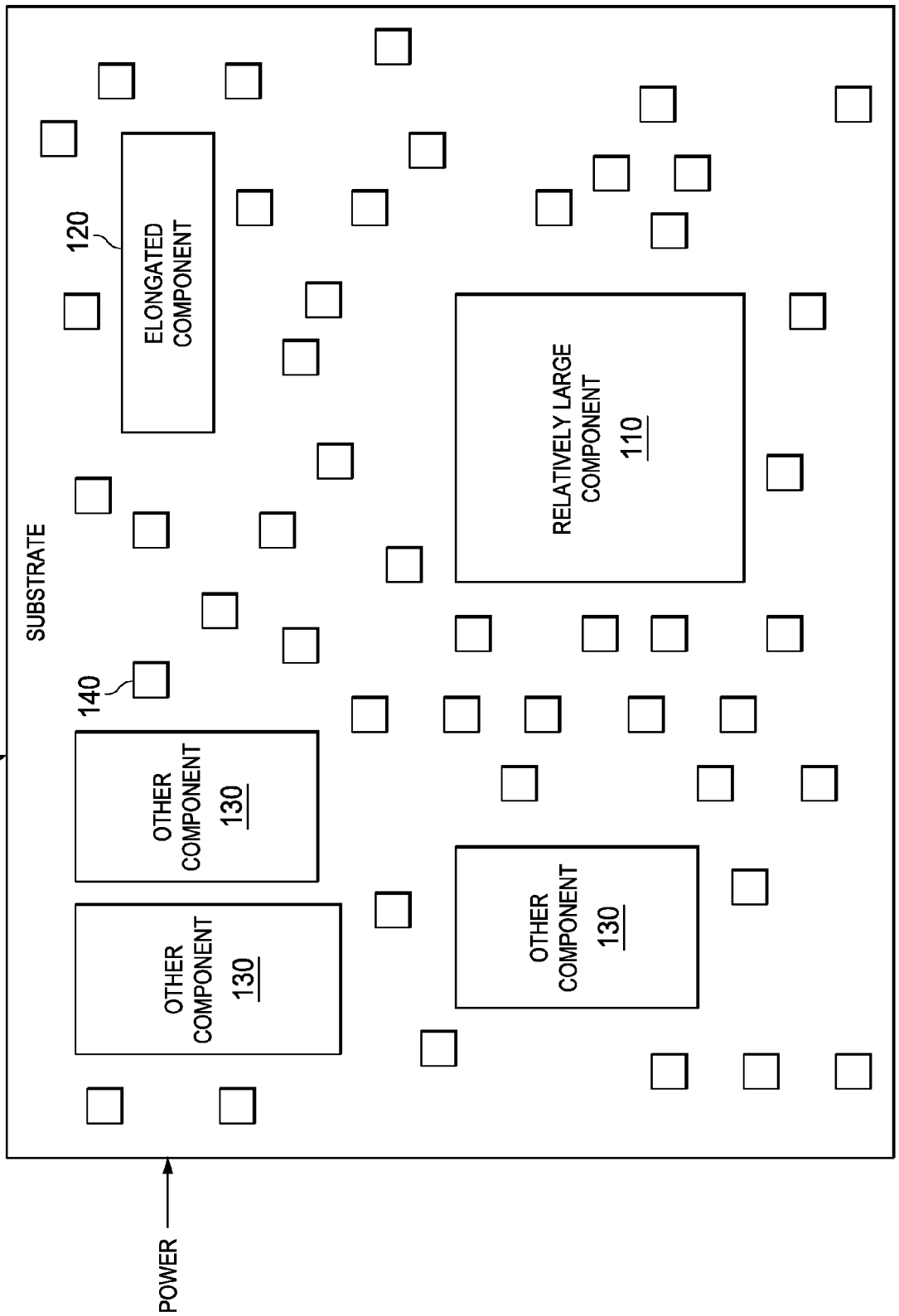
FIG. 1 is a highly schematic diagram of one embodiment of a substrate having large and small components mounted thereto.

FIG. 1 is a highly schematic diagram of one embodiment of a substrate 100 having large and small components mounted thereto.

The substrate 100 may be a PCB or any other structure on which electronic components such as ICs or discrete components may be mounted. The substrate is populated with a relatively large component 110, an elongated component 120, other relatively large or elongated components 130 and a relatively large number of relatively small components, one of which is referenced as 140.

The relatively large component 110 may be an IC having many terminals (not shown), such as a processor. The terminals may be through-hole or surface mount. If surface mount, the terminals may extend outwardly from the body of the relatively large component 110 or may form a ball grid array (BGA). Irrespective of the type and number of terminals, and the shape of its body, the relatively large component 110 may be of any kind whatsoever.

The relatively elongated component 120 may be an IC having many terminals (not shown), such as memory. The terminals may be through-hole or surface mount. If surface mount, the terminals may extend outwardly from the body of the relatively elongated component 120 or may form a BGA. Irrespective of the type and number of terminals, and the shape of its body, the relatively elongated component 120 may be of any kind whatsoever.

The other relatively large or elongated components 130 may likewise be ICs having many terminals (not shown), such as application-specific ICs (ASICs). Their terminals may be through-hole or surface mount. If surface mount, the terminals may extend outwardly from the bodies of the relatively large or elongated components 130 or may form a BGA. Irrespective of the type and number of their terminals, and the shapes of their bodies, the relatively large or elongated components 130 may be of any kind whatsoever.

As described above, the relatively small components 140 are most likely to be misoriented and therefore will be the primary subject of the orientation-tolerant land patterns that are described below. However, orientation-tolerant land patterns may also be employed with respect to the relatively large component 110, the elongated component 120 and the other relatively large or elongated components 130.

Figure 2:
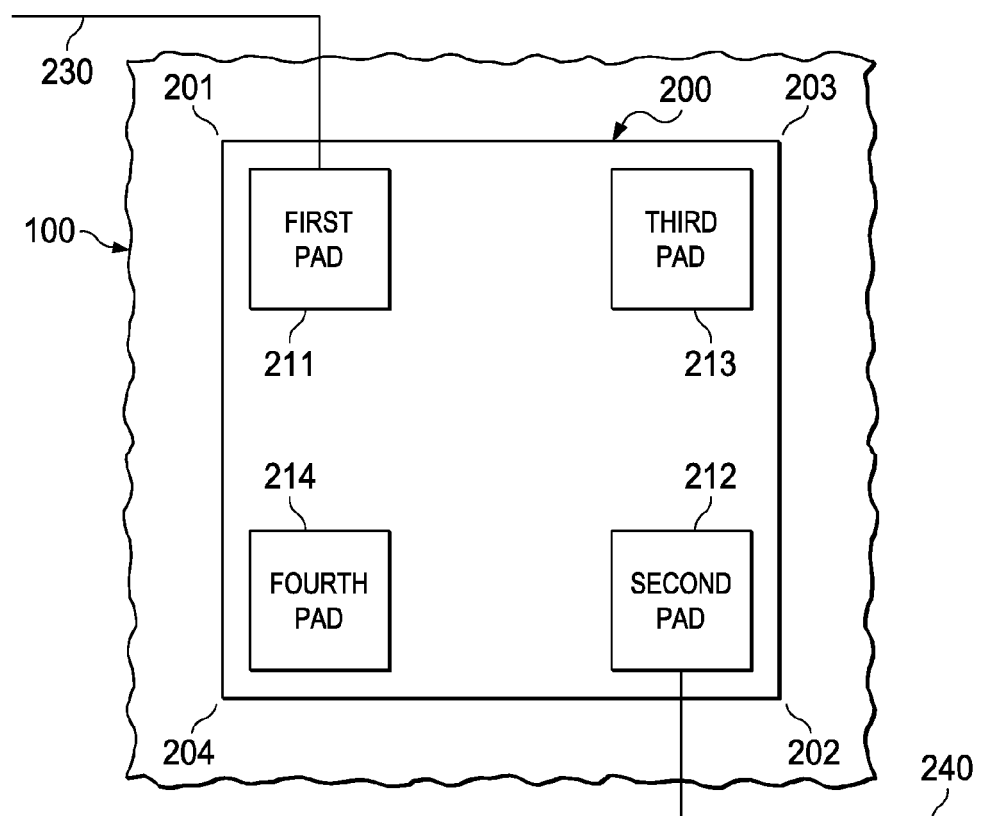
FIG. 2 is a diagram of one embodiment of a portion of the substrate of FIG. 1 and one embodiment of a orientation-tolerant land pattern thereof.

FIG. 2 is a diagram of one embodiment of a portion of the substrate 100 of FIG. 1 and one embodiment of a orientation-tolerant land pattern thereof. The land pattern includes a quadrilateral, square, rectangular, or parallelogram component outline area 200 located on a surface of the substrate 100. In one embodiment, a visible line circumscribes the component outline area 200. In an alternative embodiment, no such line exists; the component outline area 200 is instead an area of the substrate reserved for a component. The component outline area 200 has diagonally opposed first and second corners 201, 202 and diagonally opposed third and fourth corners 203, 204. The area and shape of the component outline area 200 is defined according to a footprint shape of a particular component type. For example, a particular type of surface mount capacitor may have a generally rectangular body configuration of 1 mm by 1.5 mm. A component outline area 200 defined according to this footprint shape might be 1 mm greater in both dimensions, viz.: 2 mm by 2.5 mm. In the illustrated embodiment, the component has a generally square body, which is why the component outline area 200 is generally square. Those skilled in the art should understand, however, that a component outline area may be defined in any manner according to any footprint shape whatsoever.

In the illustrated embodiment, the component outline area 200 is substantially square. However, the component outline area 200 may be of any shape that constitutes a parallelogram.

The land pattern further includes first and second exposed conductive pads 211, 212. The first and second pads 211, 212 are located within the component outline area 200 respectively proximate the first and second corners 201, 202 as FIG. 2 shows. The first and second pads 211, 212 are coupled to respective first and second circuit conductors 230, 240 of the substrate 100 and therefore function to couple a component to the first and second conductors 230, 240 when a component is placed thereon, and perhaps then soldered to the first and second pads 211, 212. Circuit conductors are defined as conductors that form part of one or more circuits embodied in the populated substrate 100. They are any conductor whatsoever, except for a conductor that performs no substantial electrical function in the one or more circuits. The first and second pads 211, 212 are configured according to a terminal configuration of the particular component type. The first and second pads 211, 212 are also separated from the third and fourth corners 203, 204. For example, a particular type of surface mount diode may have a terminal configuration in which opposing 1 mm-wide sides of its body have surface mount terminal spanning the entirety of those sides, i.e., 1 mm-wide terminals, that extend 0.5 mm into its 1 mm by 1.5 mm body. The first and second pads 211, 212 therefore might be 0.3 mm by 0.3 mm each. Those skilled in the art should understand, however, that pads may be defined in any manner according to any terminal configuration whatsoever.

Figure 3:
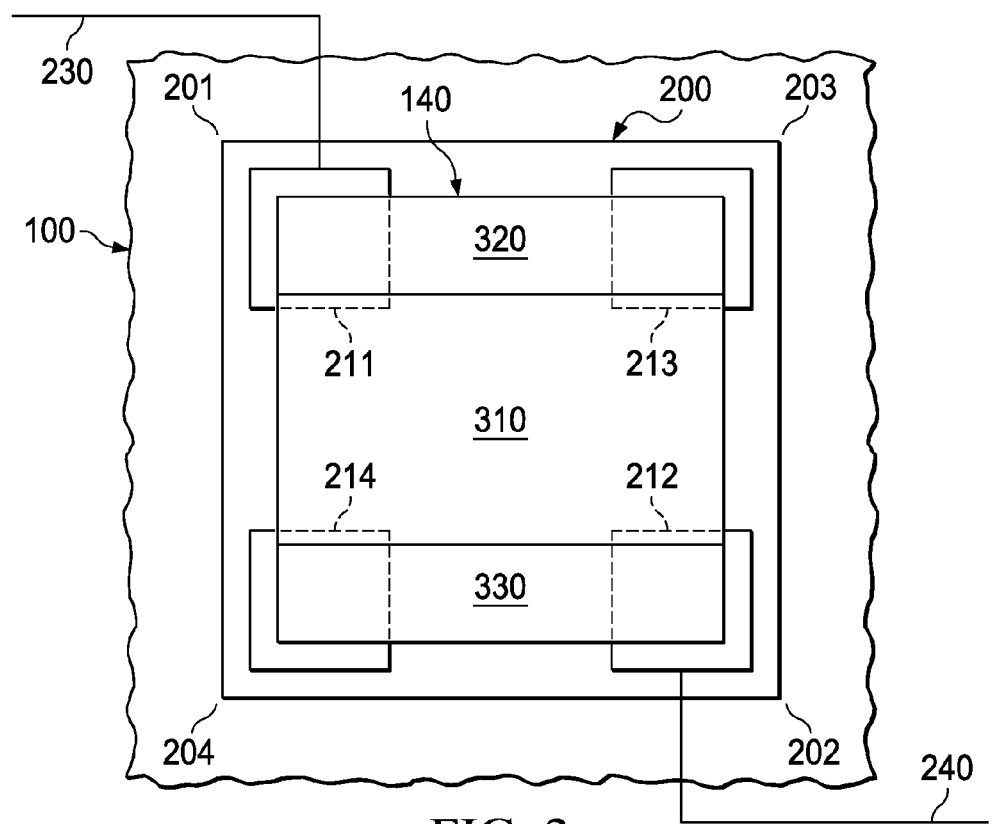
FIG. 3 is a diagram of the portion and land pattern of FIG. 2 together with a component in a first orientation.
Figure 4:
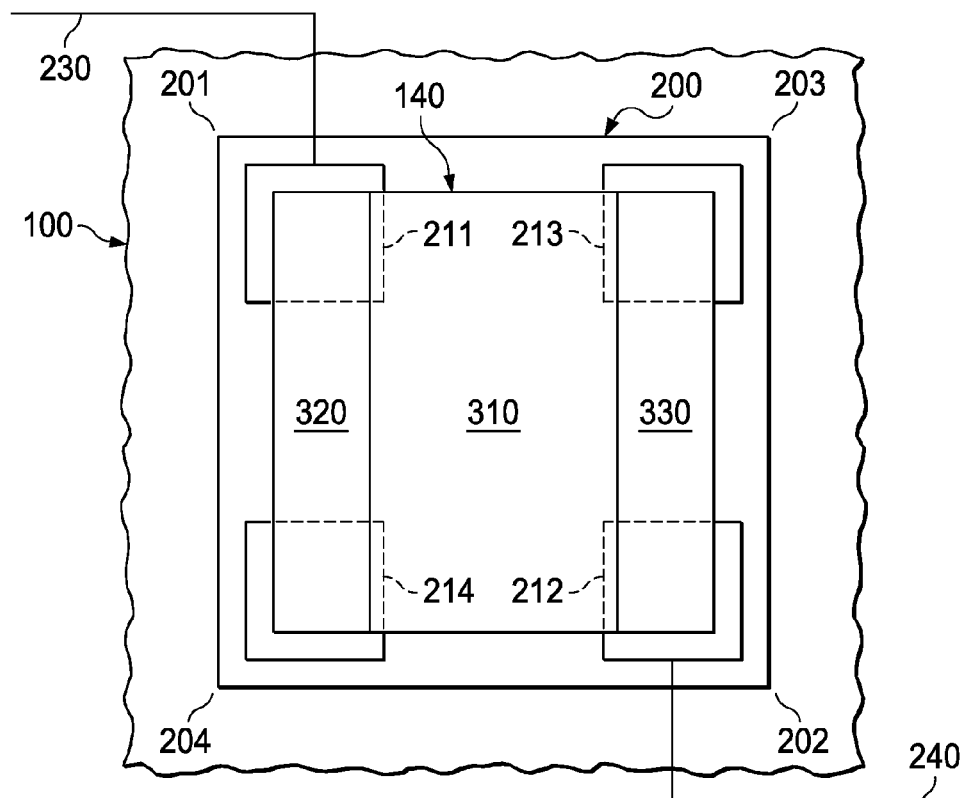
FIG. 4 is a diagram of the portion and land pattern of FIG. 2 together with the component thereof in a second orientation.

The first and second pads 211, 212 are structured such that a component of the particular component type may be placed a first orientation in which a first terminal of the component contacts the first pad 211 and extends between the first and the third corners 201, 203, and a second terminal of the component contacts the second pad 212 and extends between the second and the fourth corners 202, 204. The first and second pads 211, 212 are also structured such that a component of the very same type may be placed in a second orientation in which the first terminal contacts the first pad 211 and extends between the first and fourth corners 201, 204, and the second terminal contacts the second pad 212 and extends between the second and the third corners 202, 203. FIGS. 3 and 4, described below, will show these first and second orientations, which are relatively rotated by 180° in this example.

The land pattern yet further includes third and fourth exposed mounts 213, 214. The third and fourth mounts 213, 214 are located within the area respectively proximate the third and fourth corners 203, 204. In embodiments of the land pattern that include the third and fourth exposed mounts 213, 214, the first terminal of the component contacts the third mount 213 and the second terminal contacts the fourth mount 214 in the first orientation, and the first terminal contacts the fourth mount 214 and the second terminal contacts the third mount 213 in the second orientation. In one embodiment, the third and fourth mounts 213, 214 are nonconductive and provide a mechanical mount for the component, perhaps through the use of glue. In an alternative embodiment, the third and fourth mounts 213, 214 are conductive pads but still provide a mechanical mount for the component, perhaps through the use of solder.

FIG. 3 is a diagram of the portion of the substrate 100 and land pattern of FIG. 2 together with a component 140 in a first orientation thereover. In the illustrated embodiment, the component 140 is of a particular component type selected from the group consisting of: a two terminal contact element such as a capacitor, an inductor, a diode, or a resistor. These component types are common in the sense that they typically have only two terminals. However, the component may be of other component types with three, four, or more of terminal contacts, e.g., an integrated circuit with such numbers of terminals. In various embodiments, the particular component type is selected from the group consisting of: a through-hole component and a surface mount component. These component types are common in the sense that they can both be coupled to substrates via land patterns. In the former case, the pads (and perhaps mounts) of the land patterns would require holes to receive the terminals.

The component 140 has a body 310 and opposing first and second terminals 320, 330. In the first orientation, the first terminal 320 contacts the first pad 211 and extends between the first and the third corners 201, 203, allowing it to contact the third mount 213. The second terminal 330 contacts the second pad 212 and extends between the second and the fourth corners 202, 204, allowing it to contact the fourth mount 214. Neither the first terminal 320 nor the second terminal 330 contacts both the first pad 211 and the second pad 212. Current flowing between the first conductor 230 and the second conductor 240 passes through the component 140, and a short circuit is avoided.

FIG. 4 is a diagram of the portion and land pattern of FIG. 2 together with the component thereof in a second orientation. The first and second pads 211, 212 are also structured such that the same component may be placed in the second orientation. The second orientation differs from the first in that the first terminal 320 contacts the first pad 211 and extends between the first and fourth corners 201, 204, allowing it to contact the fourth mount 214. The second terminal 330 contacts the second pad 212 and extends between the second and the third corners 202, 203, allowing it to contact the third mount 213. As in the first orientation, current flowing between the first conductor 230 and the second conductor 240 passes through the component 140, and a short circuit is avoided.

Some two-terminal devices, e.g., diodes or certain electrolytic capacitors, are polarized. If the component 140 is polarized, only two rotations (of 0°, 90°, 180° and 270°, measured clockwise) result in the same terminal (the first or the second) being coupled to the same pad (the first or the second); the other rotations reverse polarity and are improper. In the example of FIGS. 3 and 4, only the 0° rotation of FIG. 3 and the 270° rotation result in the same polarity remaining appropriate. Therefore, with a polarized component, the first orientation is achieved with only a single rotation, and the second orientation is achieved with only a single rotation.

Most two-terminal devices, however, are not polarized. Since the first and second terminals are interchangeable, the first orientation can be achieved with either of two rotations, e.g., 0° and 180°, and the second rotation can be achieved with either of two rotations, e.g., 90° and 270°.

Figure 5:
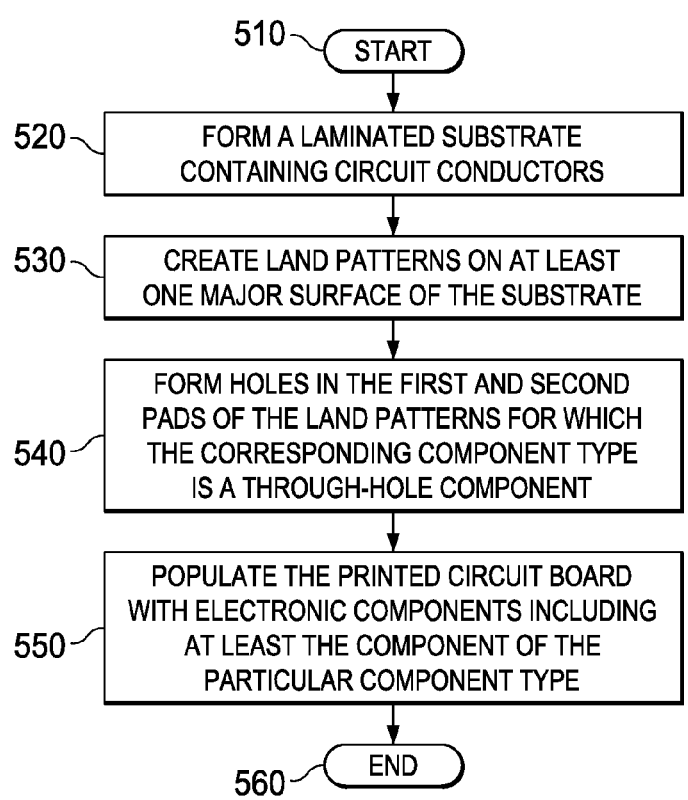
FIG. 5 is a flow diagram of one embodiment of a method of generating orientation-tolerant land patterns and manufacturing a PCB or other substrate that includes such land patterns.

FIG. 5 is a flow diagram of one embodiment of a method of generating orientation-tolerant land patterns and manufacturing a PCB or other substrate that includes such land patterns. The method begins in a start step 510. In a step 520, a laminated substrate containing circuit conductors is formed. In a step 530, land patterns are created on at least one major surface of the substrate. Some of the land patterns may be for large or large-aspect rectangular components and therefore cannot or may not need to accommodate rotation.

One or more of the remaining land patterns do accommodate rotation. Those land patterns each include: a square, rectangular, or parallelogram component outline area having diagonally opposed first and second corners and diagonally opposed third and fourth corners, defined according to a footprint shape of a particular component type and located on one of the at least one major surface. The aforementioned land patterns also include first and second exposed conductive pads located within the area respectively proximate the first and second corners, coupled to respective first and second circuit conductors of the substrate, configured according to a terminal configuration of the type and separated from the third and fourth corners.

Thus structured, the land pattern allows a component of the particular component type to be placed in one of: a first orientation in which a first terminal of the component contacts the first pad and extends between the first and the third corners and a second terminal of the component contacts the second pad and extends between the second and the fourth corners and a second orientation in which the first terminal contacts the first pad and extends between the first and fourth corners and the second terminal contacts the second pad and extends between the second and the third corners.

In a step 540, holes are formed in the first and second pads if the particular component type is a through-hole component. In a step 550, the PCB is populated with electronic components including at least the component of the particular component type. The method ends in an end step 560.

Those skilled in the art will appreciate that other and further additions, deletions, substitutions and modifications may be made to the described embodiments.

What is claimed is:

1. A land pattern, comprising:
a quadrilateral component outline area having diagonally opposed first and second corners and diagonally opposed third and fourth corners, defined according to a body configuration of a particular component type and located on a surface of a substrate; and
first and second exposed conductive pads located within said area respectively proximate said first and second corners, coupled to respective first and second circuit conductors of said substrate, configured according to a terminal configuration of said type and separated from said third and fourth corners such that a component of said particular component type may be placed in one of:
a first orientation which a first terminal of said component contacts said first pad and extends between said first and said third corners and a second terminal of said component contacts said second pad and extends between said second and said fourth corners, and a second orientation in which said first terminal contacts said first pad and extends between said first and fourth corners and said second terminal contacts said second pad and extends between said second and said third corners, wherein a circuit that comprises said land pattern is electrically insensitive to said component being in said first or second orientations.

2. The pattern as recited in claim 1 further comprising third and fourth exposed mounts located within said area respectively proximate said third and fourth corners, said first terminal contacting said third mount and said second terminal contacting said fourth mount in said first orientation and said first terminal contacting said fourth mount and said second terminal contacting said third mount in said second orientation.

3. The pattern as recited in claim 2 wherein said third and fourth mounts are electrically isolated from said circuit.

4. The pattern as recited in claim 1 wherein said area is substantially square.

5. The board as recited in claim 1 wherein said particular component type is one of:
   a capacitor,
   an inductor,
   a diode, and
   a resistor.

6. The pattern as recited in claim 1 wherein said body configuration is substantially square.

7. The pattern as recited in claim 1 wherein said particular component type has only two terminals.

8. The pattern as recited in claim 1 wherein said first orientation is attained through a selected one of a 0° and a 180° rotation and said second orientation is attained through a selected one of a 90° and a 270° rotation.

9. The board as recited in claim 1 wherein said particular component type is selected from the group consisting of:
   a through-hole component, and
   a surface mount component.

10. The pattern as recited in claim 1 wherein said substrate is a printed circuit board.

11. A method of manufacturing a printed circuit board, comprising:
   forming a laminated substrate containing circuit conductors;
   creating land patterns on at least one major surface of said substrate, some of said land patterns each including:
      a quadrilateral component outline area having diagonally opposed first and second corners and diagonally opposed third and fourth corners, defined according to a body configuration of a particular component type and located on one of said at least one major surface, and
      first and second exposed conductive pads located within said area respectively proximate said first and second corners, coupled to respective first and second circuit conductors of said substrate, configured according to a terminal configuration of said type and separated from said third and fourth corners such that a component of said particular component type may be placed in one of:
         a first orientation in which a first terminal of said component contacts said first pad and extends between said first and said third corners and a second terminal of said component contacts said second pad and extends between said second and said fourth corners, and
         a second orientation in which said first terminal contacts said first pad and extends between said first and fourth corners and said second terminal contacts said second pad and extends between said second and said third corners,
      wherein a circuit that comprises said land pattern is electrically insensitive to said component being in said first or second orientations.

12. The method as recited in claim 11 wherein said some of said land patterns each further include third and fourth exposed mounts located within said area respectively proximate said third and fourth corners, said first terminal contacting said third mount and said second terminal contacting said fourth mount in said first orientation and said first terminal contacting said fourth mount and said second terminal contacting said third mount in said second orientation.

13. The method as recited in claim 11 wherein said area is substantially square.

14. The method as recited in claim 11 wherein said particular component type is one of:
   a capacitor,
   an inductor,
   a diode, and
   a resistor.

15. The method as recited in claim 11 wherein said body configuration is substantially square.

16. The method as recited in claim 11 wherein said particular component type has only two terminals.

17. The method as recited in claim 11 wherein said first orientation is attained through a selected one of a 0° and a 180° rotation and said second orientation is attained through a selected one of a 90° and a 270° rotation.

18. The method as recited in claim 11 wherein said particular component type is selected from the group consisting of:
   a through-hole component, and
   a surface mount component, said method further comprising forming holes in said first and second pads if said particular component type is a through-hole component.

19. The method as recited in claim 11 further comprising populating said printed circuit board with electronic components including at least said component of said particular component type.

20. A printed circuit board, comprising:
   a substantially square component outline area having diagonally opposed first and second corners and diagonally opposed third and fourth corners, defined according to a substantially square body configuration of a particular component type and located on a surface of a substrate;
   first and second exposed conductive pads located within said area respectively proximate said first and second corners, coupled to respective first and second circuit conductors of said substrate and configured according to a terminal configuration of said type; and
   third and fourth electrically isolated exposed mounts located within said area respectively proximate said third and fourth corners, said first and second pads separated from said third and fourth corners and said third and fourth mounts separated from said first and second corners such that a component of said particular component type may be placed in one of:
      a first orientation in which a first terminal of said component contacts said first pad and said third mount and a second terminal of said component contacts said second pad and said fourth mount, and a second orientation in which said first terminal contacts said first pad and said fourth mount and said second terminal contacts said second pad and said third mount.

21. The board as recited in claim 20 wherein said particular component type is one of:
   a capacitor,
   an inductor,
   a diode, and
   a resistor.

22. The board as recited in claim 20 wherein said particular component type has only two terminals.

23. The board as recited in claim 20 wherein said first orientation is attained through a selected one of a 0° and a 180° rotation and said second orientation is attained through a selected one of a 90° and a 270° rotation.

24. The board as recited in claim 20 wherein said particular component type is selected from the group consisting of:
   a through-hole component, and
   a surface mount component.

25. An apparatus, comprising:
   a substrate or circuit board having a land pattern along a surface of the substrate or circuit board; and
   an electronic component having two or more terminals electrically connected to conductive pads of the land pattern, wherein the terminals of the component and the land pattern are configured such that the terminals are able to contact the contact pads in a first orientation of the component and a second orientation of the component, the second orientation being related to the first orientation by a rotation of the component by about 60° to about 120°, the terminals of the component having different footprints along the surface in the first and second orientations,
   wherein a circuit that comprises said land pattern is electrically insensitive to said electrical component being in said first or second orientations.

26. The apparatus of claim 25 wherein each terminal is able to physically contact the same conductive pad in the first and second orientation.

27. The apparatus of claim 25 wherein the rotation is about 70° to about 110°.

28. The apparatus of claim 27 wherein one of the terminals is able to physically contact a different conductive pad in the second and first orientations.

29. The apparatus claim 27 wherein the component has at least three terminals that contact the conductive pads.

* * * * *